United States Patent [19]

Garron

[11] Patent Number: 4,957,828

[45] Date of Patent: Sep. 18, 1990

[54] EMERGENCY BATTERY MONITOR

[75] Inventor: Stephen A. Garron, Elizabeth, N.J.

[73] Assignee: SSMC Inc, Edison, N.J.

[21] Appl. No.: 281,609

[22] Filed: Dec. 9, 1988

[51] Int. Cl.$^5$ .......................................... H01M 10/48
[52] U.S. Cl. ...................................... 429/92; 429/93; 73/304 R
[58] Field of Search .................................. 429/91–93; 73/304 R

[56] References Cited

U.S. PATENT DOCUMENTS 4,371,790 2/1983 Manning et al. .................. 73/304 R

FOREIGN PATENT DOCUMENTS

| 3100503 | 8/1982 | Fed. Rep. of Germany | 429/92 |
| 862274 | 9/1981 | U.S.S.R. | 439/92 |
| 2093594 | 9/1982 | United Kingdom | 73/304 R |

Primary Examiner—Stephen J. Kalafut
Attorney, Agent, or Firm—Theodore Jay

[57] ABSTRACT

An emergency battery monitor is adapted for use with at least one storage battery. The battery has first and second output terminals across which an output voltage is produced, the battery, when in normal operation, exhibiting an output voltage falling within a nominal value range having predetermined maximum and minimum values. The battery has at least one cell which contains a liquid electrolyte. The electrolyte, when the battery is in normal operation, has a predetermined minimum level in the cell. The monitor includes a member associated with the cell, which is electrically conductive when the level of the electrolyte is at least equal to the minimum level and is electrically non-conductive when the level of the electrolyte falls below the minimum level. Integrated circuits coupled to the output terminals and the member produce a first signal designating normal battery operation when the member is conductive and the value of the output voltage falls within the nominal value range. The circuits produce a second signal designating abnormal battery operation when the value of the output signal falls below the minimum value, and/or the member is non-conductive, and produces a third signal designating abnormal battery operation when the value of the output signal exceeds the maximum value.

6 Claims, 2 Drawing Sheets

EMERGENCY BATTERY MONITOR

BACKGROUND OF THE INVENTION

Sudden and unanticipated cutoffs in the normal supply of electrical energy to facilities such as operation rooms in hospitals and the like can create significant hazards to life and property. Accordingly, such facilities often have a backup battery system which is normally not in use but which is automatically or manually connected in circuit to supply, on an emergency basis, enough electrical energy to such facility to keep it operating during the period when the normal supply of energy is interrupted.

However, backup battery systems, if not suitably monitored, may not function in time of need because of battery failures or other associated problems which have gone undetected during periods of nonuse.

The present invention is directed toward a device, an emergency power monitor, which can be used to monitor the performance of storage batteries at any time while the backup system is not in use and which will generate signals which can be used to operate suitable warning devices when such performance is shown unsuitable.

Many types of emergency power monitors are known in the art. However, an emergency power monitor in accordance with the present invention is characterized by new simple inexpensive circuitry which operates reliably at all times and, moveover, when activiated will produce the requisite signals when the battery output voltage exceeds or falls below predetermined maximum or minimum values and/or when the level of electrolyte in a battery cell falls below a predetermined minimum value.

SUMMARY OF THE INVENTION

In accordance with the principles of this invention, an emergency battery monitor is adapted for use with at least one storage battery. The battery has first and second output terminals across which an output voltage is produced. The battery, when in normal operation, exhibits an output voltage falling within a nominal value range having predetermined maximum and minimum values. The battery has at least one cell which contains a liquid electrolyte. The electrolyte, when the battery is in normal operation, has a predetermined minimum level in the cell.

The monitor contains first means associated with the cell, which is electrically conductive when the level of the electrolyte is at least equal to the minimum level and which is electrically non-conductive when the level of the electrolyte falls below the minimum level.

The monitor also contains second means coupled to the output terminals and the first means to produce a first signal designating normal battery operation when the first means is conductive and the value of the output voltage falls within the nominal value range. The second means produces a second signal designating abnormal battery operation when the value of the output signal falls below the minimum value, and/or the first means is non-conductive, and also produces a third signal designating abnormal battery operation when the value of the output signal exceeds the maximum value.

These signals can be used to actuate various types of warning devices in the manner previously indicated.

DETAILED DESCRIPTION OF THE PREFERRED EMBODIMENTS

Figure 1:
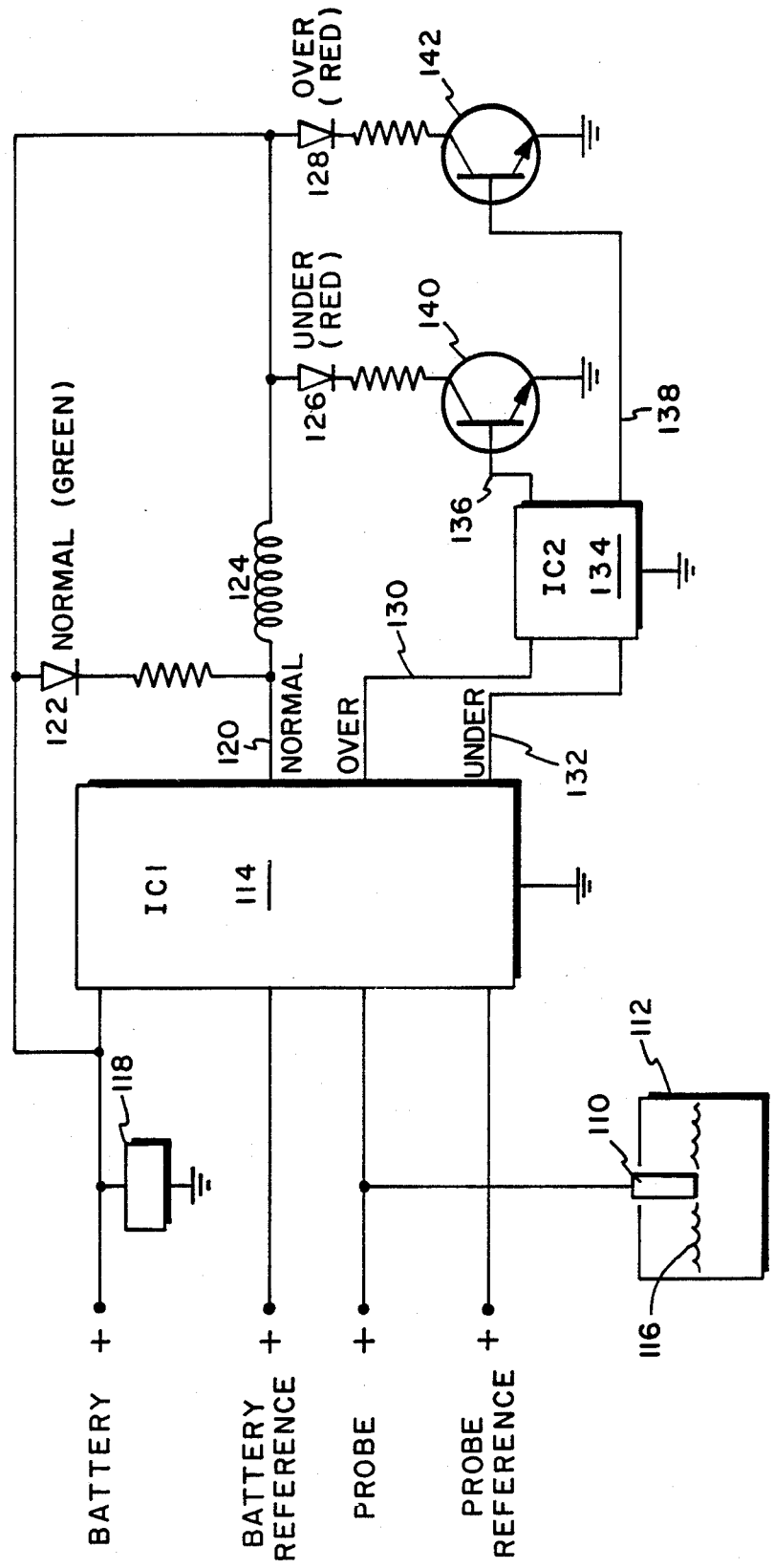
FIG. 1 is a simplified block diagram illustrating the principles of the invention.

Referring first to FIG. 1, an electrically conductive probe 110 is partially inserted in a selected cell 112 of a storage battery. One end of the probe is connected to an input of a first integrated circuit 114. When the liquid electrolyte 116 in the cell attains or exceeds a predetermined minimum level, an opposite end of the probe engages the electrolyte, current flows through the probe and a voltage is developed. When the level of the electrolyte falls below the minimum, the probe is spaced from the electrolyte and no current flows through the probe.

The output voltage from the battery 118 is supplied to a second input of integrated circuit 114. The output voltage of the battery during normal operation will have a nominal value falling between predetermined maximum and minimum values. The circuit is connected in a manner shown in more detail in FIG. 2 to develop suitable reference voltages and compare them with the output voltage and probe voltages respectively.

When the comparisons establish that the electrolyte is maintained at or above the predetermined minimum level and the battery output voltage has a correct nominal value, the circuit produces a first or normal signal at output lead 120, and green emitting LED 122 is energized and emits light. No voltages appear at output leads 130 and 132. Current flows through coil 124 and LEDs 126 and 128 remain dark and deenergized.

When the comparison shows that either the nominal voltage of the battery drops below the predetermined minimum value and/or the electrolyte level has fallen below the predetermined minimum level, a suitable voltage signifying abnormal operation of under voltage is produced at lead 132. No signal appears at output lead 120 and no voltage appears at lead 130. Lead 132 is connected as a first input to a second integrated circuit 134. When an under voltage condition is present, circuit 134 produces a second signal at output lead 136 which causes transistor 140 to conduct current, energizing LED 126 which emits red light signifying the under voltage. The other two LEDs are dark and deenergized.

Similarly, if the comparison shows that the nominal voltage exceeds the predetermined maximum level, a suitable voltage signifying abnormal operation of over voltage is produced at lead 130. No signal appears at output Lead 120 and no voltage appears at Lead 132. Lead 130 is connected as a second input to circuit 134. When an over voltage condition is present, circuit 134 produces a third signal at lead 138 which causes transistor 142 to conduct current, emergency LED 128 which omits red light signifying the over voltage. The other two LEDs are dark and deenergized.

Figure 2:
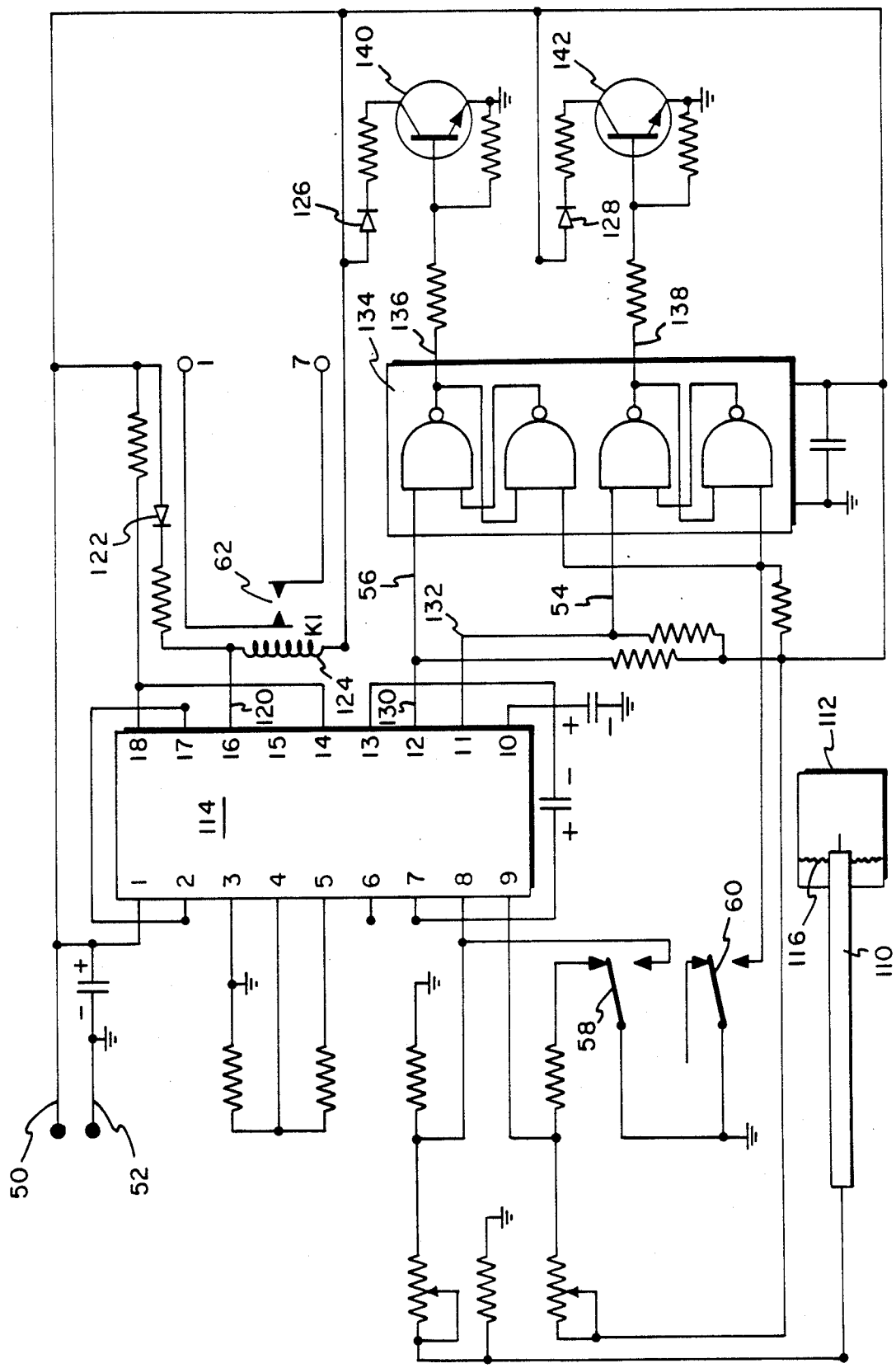
FIG. 2 is a circuit diagram of a present embodiment of the invention.

Referring now to FIG. 2, the first circuit 114 can be a conventional circuit identified by its manufacturer Unitrode Corporation as a linear integrated circuit, quad supply and line monitor, designated a type UC 3903. Similarly, the second circuit 134 can be a conventional circuit of flip-flops and is identified as type CD4011B.

The output terminals 50 and 52 of battery 18 are connected to circuit 114 as shown. The probe 110 is also connected at one end to circuit 14 as shown. The terminals 3, 4 and 5 of circuit 114 with associated resistors establish to reference comparison voltage for the battery output voltage and the terminal of circuit 114 establishes the reference voltage for the probe. The first signal appears at terminal 16 of circuit 114. The under voltage operation is initiated by a voltage which appears at terminal 11 of circuit 114. Terminal 11 is connected to input 54 of circuit 134 which energizes LED 126 as previously explained. The over voltage operation is initiated by a voltage which appears at terminal 12 of circuit 114. Terminal 12 is connected to input 56 of circuit 134 which energizes LED 128 as previously explained.

When test position switch 58 is in its normal position as shown in FIG. 2, the monitor is deactivated. When the switch, which can be of push button type, is momentarily placed in the ON position, the monitor is activated as described. A reset switch 60 can be used to reset the circuit 134 and turn off any of lit LEDs 126 and 128 after the over or under voltage detected conditions have been corrected.

Coil 124 can be the coil of a relay having contacts 62 which can be set to be opened or set to be closed when current flows through the coil, that is when either an over voltage or under voltage condition exists. When a plurality of batteries are interconnected each battery can have a monitor and the contacts of all monitor relays can be connected in such manner as to enable an operator to determine whether or not all batteries are functioning properly. The contacts can be set to be open for normal battery operation whereby if connected in parallel arrangement to a test voltage source through an LED, the LED will be dark indicating normal operation of all batteries. An abnormal condition in any battery will cause the contacts of its relay to close and energize the LED. This will alert an operator that at least one battery has an abnormal condition whereby the operator can check each battery in order to find the problem battery.

Similarly the contacts can be set to be closed in normal operation whereby if connected in series with an LED to a test voltage source, the LED will be lit indicating normal operation of all batteries. An abnormal condition in any any battery will cause the contacts of its relay to open thus interrupting current flow and extinguishing the LED. This action will alert the operator as before.

What is claimed is:

1. An emergency battery monitor adapted for use with at least one storage battery, the battery having first and second output terminals across which an output voltage is produced, the battery, when in normal operation, exhibiting an output voltage falling within a nominal value range having maximum and minimum values, the battery having at least one cell which contains a liquid electrolyte, the electrolyte, when the battery is in normal operation, having minimum level in the cell, said monitor comprising:
   first means associated with the cell, the first means being electrically conductive when the level of the electrolyte is at least equal to the minimum level and being electrically non-conductive when the level of the electrolyte falls below the minimum level; and
   second means coupled to the output terminals and the first means to produce a first signal designating normal battery operation when the first means is conductive and the value of the output voltage falls within the nominal value range, the second means producing a second signal designating abnormal battery operation when the value of the output signal falls below the minimum value, and/or the first means is non-conductive, the second means producing a third signal designating abnormal battery operation when the value of the output signal exceeds the maximum value.

2. The monitor of claim 1 wherein the first means is an electrically conductive member which is in contact with the electrolyte as long as its level is at least equal to the minimum level and which is out of contact with the electrolyte when the level of the electrolyte falls below the minimum level.

3. The monitor of claim 2 wherein the member is a tungsten probe.

4. The monitor of claim 1 wherein the second means includes first and second integrated circuits, the first circuit having inputs coupled to the first means and the output terminals and having first, second and third outputs, the first signal being produced at the first output of the first circuit, the second circuit having inputs coupled to the second and third outputs of the first circuit, the second circuit having a first output at which the second signal is produced and having a second output at which the third signal is produced.

5. The monitor of claim 4 wherein the first output of the first circuit and the first and second outputs of the second circuit each include an LED.

6. The monitor of claim 5 wherein the presence of any one of the signals is identified by light being emitted from the corresponding LED, all other LEDs being dark.

* * * * *